(12) United States Patent  
Johnson

(10) Patent No.: US 7,622,969 B2
(45) Date of Patent: Nov. 24, 2009

(54) METHODS, DEVICES, AND SYSTEMS FOR A DELAY LOCKED LOOP HAVING A FREQUENCY DIVIDED FEEDBACK CLOCK

(75) Inventor: Gary M. Johnson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/959,094

(22) Filed: Dec. 18, 2007

(65) Prior Publication Data

US 2009/0153205 A1 Jun. 18, 2009

(51) Int. Cl.
*H03L 7/06* (2006.01)
(52) U.S. Cl. .................... 327/158; 327/149; 327/163
(58) Field of Classification Search ......... 327/147–150, 327/156–159, 162, 163; 375/376; 331/DIG. 2
See application file for complete search history.

(56) References Cited

U.S. PATENT DOCUMENTS

| | | | | |
|---|---|---|---|---|
| 5,910,740 | A * | 6/1999 | Underwood | 327/149 |
| 6,208,183 | B1 * | 3/2001 | Li et al. | 327/161 |
| 6,281,726 | B1 | 8/2001 | Miller, Jr. | |
| 6,346,838 | B1 * | 2/2002 | Hwang et al. | 327/156 |
| 6,356,158 | B1 * | 3/2002 | Lesea | 331/11 |
| 6,373,913 | B1 * | 4/2002 | Lee | 375/376 |
| 6,404,248 | B1 | 6/2002 | Yoneda | |
| 6,509,776 | B2 * | 1/2003 | Kobayashi et al. | 327/277 |
| 6,727,739 | B2 | 4/2004 | Stubbs et al. | |
| 6,968,026 | B1 | 11/2005 | Li et al. | |
| 7,038,511 | B2 | 5/2006 | Kim et al. | |
| 7,111,185 | B2 | 9/2006 | Gomm et al. | |
| 7,126,393 | B2 * | 10/2006 | Becker et al. | 327/161 |
| 7,248,532 | B2 | 7/2007 | Schoenfeld | |
| 7,253,668 | B2 | 8/2007 | Johnson | |
| 7,268,531 | B2 | 9/2007 | Lin et al. | |
| 7,304,516 | B2 * | 12/2007 | Johnson | 327/158 |
| 2005/0275439 | A1 | 12/2005 | Johnson | |
| 2006/0261869 | A1 | 11/2006 | Gomm et al. | |

* cited by examiner

*Primary Examiner*—Lincoln Donovan
*Assistant Examiner*—Hai L Nguyen
(74) *Attorney, Agent, or Firm*—TraskBritt

(57) ABSTRACT

Methods, devices, and systems are disclosed for a delay locked loop. A delay locked loop may comprise a delay line configured to receive a reference clock signal and output a delayed clock signal. The delay locked loop may also comprise a feedback loop including a frequency divider operably coupled to the delayed clock signal and configured to generate a frequency divided clock signal. Furthermore, the delay locked loop may include a phase detector configured to receive the reference clock signal and the frequency divided clock signal having a frequency less than that of the reference clock signal. Additionally, the phase detector may be configured to measure a phase difference of the reference clock signal and the frequency divided clock signal upon receipt of an active edge of the frequency divided clock signal.

25 Claims, 5 Drawing Sheets

US 7,622,969 B2

METHODS, DEVICES, AND SYSTEMS FOR A DELAY LOCKED LOOP HAVING A FREQUENCY DIVIDED FEEDBACK CLOCK

TECHNICAL FIELD

Embodiments of the present invention relate to semiconductor integrated circuits. More particularly, embodiments of the present invention relate to a delay locked loop, to devices and systems utilizing the same, and to methods of operation.

BACKGROUND

Modern high-speed integrated circuit (IC) devices, such as synchronous dynamic random access memories (SDRAM), microprocessors, etc., rely upon clock signals to control the flow of commands, data, addresses, etc., into, through, and out of the devices. The improved performance of ICs and the growing trend to include several computing devices or system components on a single circuit board present a challenge with respect to synchronizing the timing of all system components.

One synchronization implementation includes a delay locked loop which is used as an internal clock signal generator. Conventional delay locked loops use an adjustable delay line comprised of a series of connectable delay elements. Digital information is used to either include or exclude a certain number of delay elements within a delay line. In a conventional delay locked loop, a clock input buffer accepts a reference clock signal and transmits the signal to one or more delay lines including delay elements. The delay of the delay path is increased from a minimum setting until the edge of a delayed clock signal is eventually time-shifted just past the next corresponding edge of the reference clock signal. As an element of a conventional delay locked loop, a digital phase detector controls the delay line propagation delay so that the delayed clock signal remains synchronized with the reference clock signal. The reference clock is then used to synchronize outgoing data bits with an incoming clock signal independent of the clock frequency.

FIG. 1 is a block diagram illustrating a conventional delay locked loop 100 including a variable delay line 102 that receives a buffered clock signal BCLK and generates a delayed clock signal DCLK in response to buffered clock signal BCLK. The variable delay line 102 controls a variable delay DD of delayed clock signal DCLK signal relative to the buffered clock signal BCLK in response to a delay adjustment signal DA. A feedback delay line 104 generates a feedback clock signal FBCLK in response to delayed clock signal DCLK, wherein feedback clock signal FBCLK has a model delay (DI+DO) relative to delayed clock signal DCLK. The DI component of the model delay (DI+DO) corresponds to a delay introduced by an input buffer 106, while the DO component of the model delay corresponds to a delay introduced by an output buffer 108. Although input buffer 106 and output buffer 108 are illustrated as single components, each represents all components and the associated delay between the input and output of the delay locked loop 100. Stated another way, input buffer 106 represents the delay DI of all components between an input that receives reference clock signal CLK and an input to the variable delay line 102. Furthermore, output buffer 108 represents the delay DO of all components between the output of the variable delay line 102 and an output at which synchronized clock signal SYNCCLK is generated. Delay lock loop 100 further includes a phase detector 110 that receives feedback clock signal FBCLK and buffered clock signal BCLK, and generates a delay control signal DCON having a value indicating a phase difference between the BCLK and FBCLK signals. A delay controller 112 generates the DA signal in response to the DCON signal from the phase detector 110, and applies the DA signal to the variable delay line 102 to adjust the variable delay DD of delayed clock signal DCLK.

In operation, phase detector 110 detects a phase difference between buffered clock signal BCLK and feedback clock signal FBCLK. Thereafter, phase detector 110 and delay controller 112 operate in combination to adjust the variable delay DD of delayed clock signal DCLK signal until the phase difference between the BCLK and FBCLK signals is approximately zero. More specifically, as the variable delay DD of delayed clock signal DCLK signal is adjusted, the phase of the feedback clock signal FBCLK from the feedback delay line 104 is adjusted accordingly until the feedback clock signal FBCLK is in phase with buffered clock signal BCLK. When the delay locked loop 100 has adjusted the variable delay DD to a value causing the phase shift between the BCLK and FBCLK signals to equal approximately zero, the delay locked loop 100 is "locked." When the delay locked loop 100 is locked, the CLK and SYNCCLK signals are synchronized.

As clock speeds of electronic systems increase, conventional delay locked loops and, more specifically, feedback lines within conventional delay locked loops, may exhibit operational problems including increased operating current, transient noise, and duty cycle distortion. As a result, the accuracy and performance of a delay locked loop may be affected.

There is a need for methods, devices, and systems to enhance the operation of delay locked loops.

DETAILED DESCRIPTION

In the following detailed description, reference is made to the accompanying drawings that form a part hereof and, which is shown by way of illustration, specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the disclosure.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the various embodiments of the present invention may be practiced by numerous other partitioning solutions. For the most part, details concerning timing considerations, and the like, have been omitted where such details are not necessary to obtain a complete understanding of the present invention in its various embodiments and are within the abilities of persons of ordinary skill in the relevant art.

Figure 2:
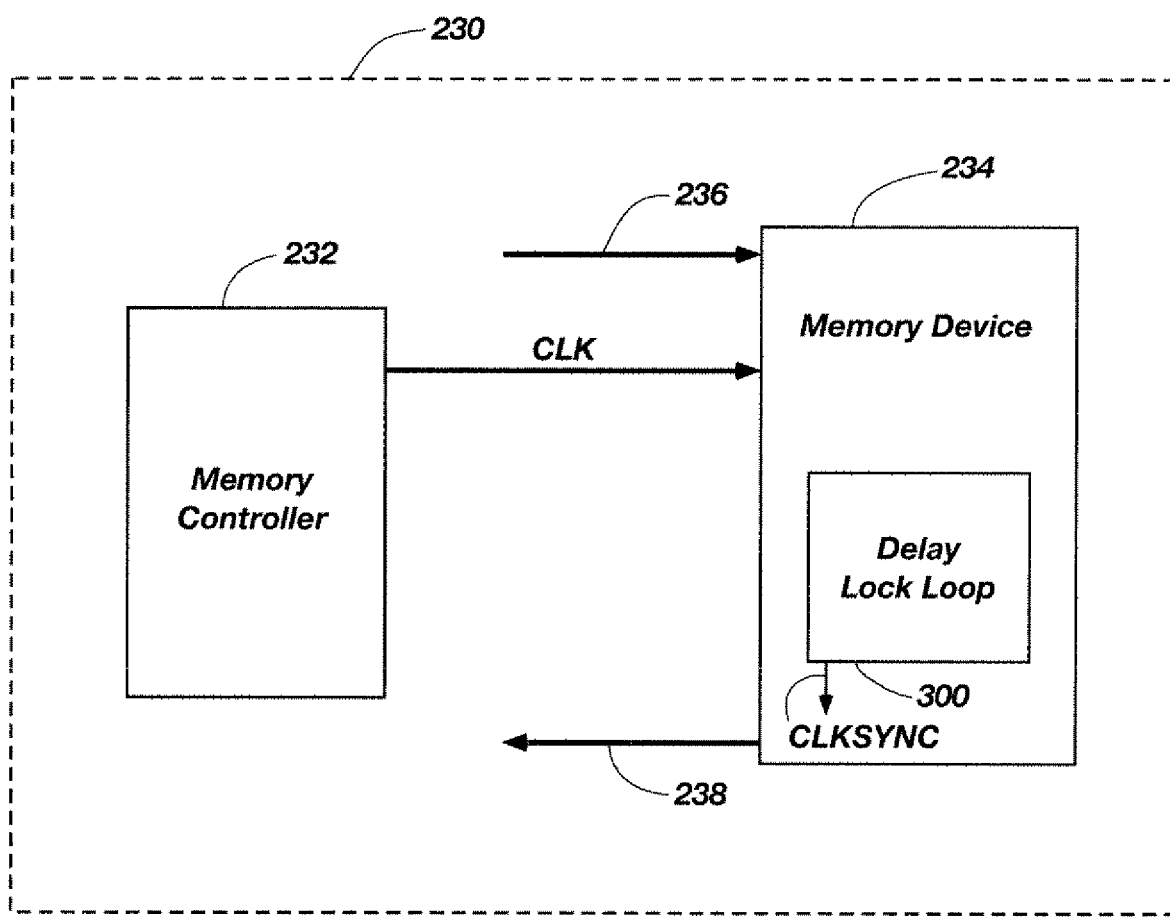
FIG. 2 is a block diagram of a memory system including a delay locked loop, according to an embodiment of the disclosure.

FIG. 2 illustrates a memory system 230 comprising a memory controller 232 operatively coupled to one or more memory devices 234, each capable of storing data. Memory controller 232 may be configured to control operations of memory system 230 such as, storing and extracting data to and from memory device 234. In operation, memory device 234 may receive an input signal 236, which may contain data to be written into memory device 234. Furthermore, memory device 234 may provide an output signal 238, which may comprise data that is being output from memory device 234. As known in the art, proper timing of the data signals carrying data from memory device 234 is useful in extracting data accurately. As such, it may be advantageous for input signal 236 and output signal 238 to be synchronized to a reference clock signal CLK. Therefore, a delay locked loop 300, in accordance with one or more embodiments of the disclosure, may be employed to control signal skew and synchronize various digital signals (e.g., operation clocks, data signals, etc.) to ensure that data operations are performed within acceptable timing windows. More specifically, delay locked loop 300 may be configured to receive a reference clock signal CLK and provide a synchronized output clock signal CLKSYNC, as described more fully below. Synchronized output clock signal CLKSYNC may be used internally to synchronize data output signal 238 and, in some embodiments, synchronized output clock signal CLKSYNC may be available external to memory device 234. Although delay locked loop 300 is illustrated in FIG. 2 as being located within memory device 234, delay locked loop 300 may be located within other portions of memory system 230, such as in memory controller 232. In addition, while much of the discussion herein is in the context of memories and memory subsystems, those of ordinary skill in the art will recognize that embodiments described herein are equally applicable to other semiconductor devices, such as, for non-limiting examples, general purpose processors, special purpose processors, image processors, image capture devices, non-volatile memories, and application specific integrated circuits.

Figure 3:
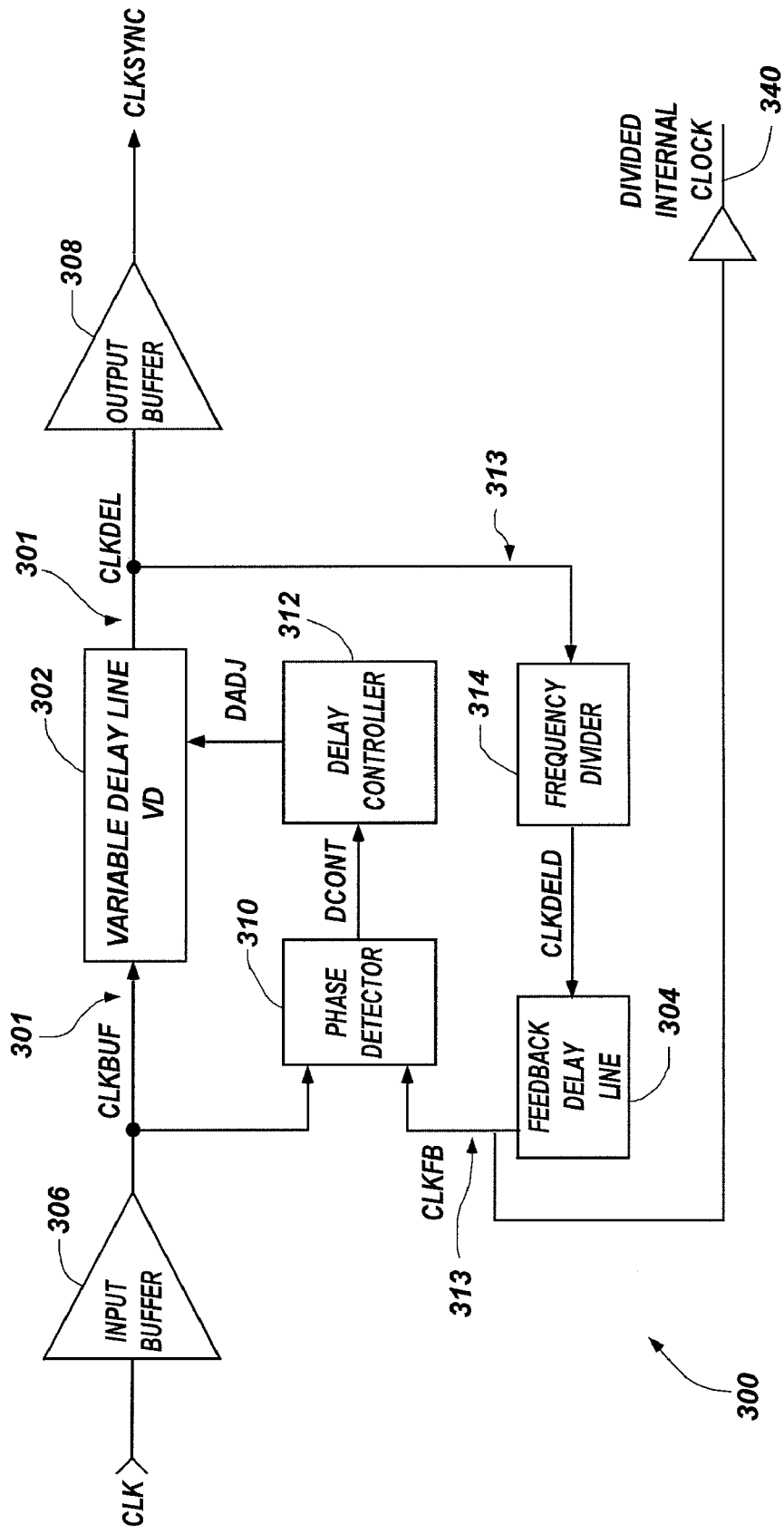
FIG. 3 is a block diagram of a delay locked loop, according to an embodiment of the disclosure.

FIG. 3 is a block diagram illustrating delay locked loop 300 in accordance with all embodiment of the disclosure. Delay locked loop 300 may include a forward path 301 having a variable delay line 302 operably coupled between an input buffer 306 and an output buffer 308. Input buffer 306 may be configured to receive reference clock signal CLK (which may also be referred to as an external clock signal) from an external source and output a buffered reference clock signal CLK-BUF. For example, reference clock signal CLK may be transmitted from memory controller 232 (see FIG. 2), or reference clock signal CLK may be generated independently by a clock generator (not shown) within electronic system 600 (see FIG. 5). As known in the an, variable delay line 302 may be configured to receive buffered reference clock signal CLK-BUF from input buffer 306, make adjustments to a loop delay by inserting or bypassing propagation delay elements within variable delay line 302, and output delayed clock signal CLKDEL. Furthermore, the amount of propagation delay, which may also be characterized as a delay period, through each delay element may be adjusted to create the variable delay VD, or a combination of delay element adjustment, delay element addition and delay element bypassing may be used. Those of ordinary skill in the art will appreciate that variable delay line 302 may insert a desired delay into an internal clock (not shown) of memory device 234 (see FIG. 2) through one or more internal clock buffers (not shown) such that the internal clock, as delayed by variable delay line 302 and buffered by an internal clock buffer, results in an output signal CLKSYNC synchronized with reference clock signal CLK.

Embodiments may also include a divided internal clock 340 from divided buffer 342 that is driven from a feedback clock signal CLKFB. Thus, the semiconductor device would have access to an internal clock (not shown) and the divided internal clock 340 with a desired skew (which may be substantially zero) relative to each other.

Delay locked loop 300 may also include a feedback loop 313 having a frequency divider 314 operably coupled between an output of variable delay line 302 and a feedback delay line 304. Furthermore, frequency divider 314 may be configured to receive delayed clock signal CLKDEL from variable delay line 302 and output a frequency divided clock signal CLDELD to feedback delay line 304. Frequency divider 314 may generate frequency divided clock signal CLKDELD by dividing a frequency of delayed clock signal CLKDEL by a desired amount. For example, frequency divider 314 may receive delayed clock signal CLKDEL and divide a frequency of delayed clock signal CLKDEL by an integer, such as two, three, four, five, etc., and, thereafter, frequency divider 314 may generate a respective frequency divided clock signal CLKDELD having a frequency that is one-half, one-third, one-fourth, one-fifth etc., of the frequency of delayed clock signal CLKDEL. For explanatory purposes only, and not by way of limitation, frequency divider 314 may be configured to receive delayed clock signal CLKDEL with a frequency of 0.5 GHz and output a frequency divided clock signal CLKDELD with a frequency of 0.25 GHz, 0.167 GHz, or 0.125 GHz, corresponding to frequency reductions of one-half one-third, and one-fourth, respectively. According to one embodiment of the disclosure, frequency divider 314 may be hardwired to perform frequency division by a desired amount (e.g., 2, 3, or 4). In another embodiment, frequency divider 314 may be configured to receive a register command indicating an amount of frequency division that is to be performed.

Figure 1:
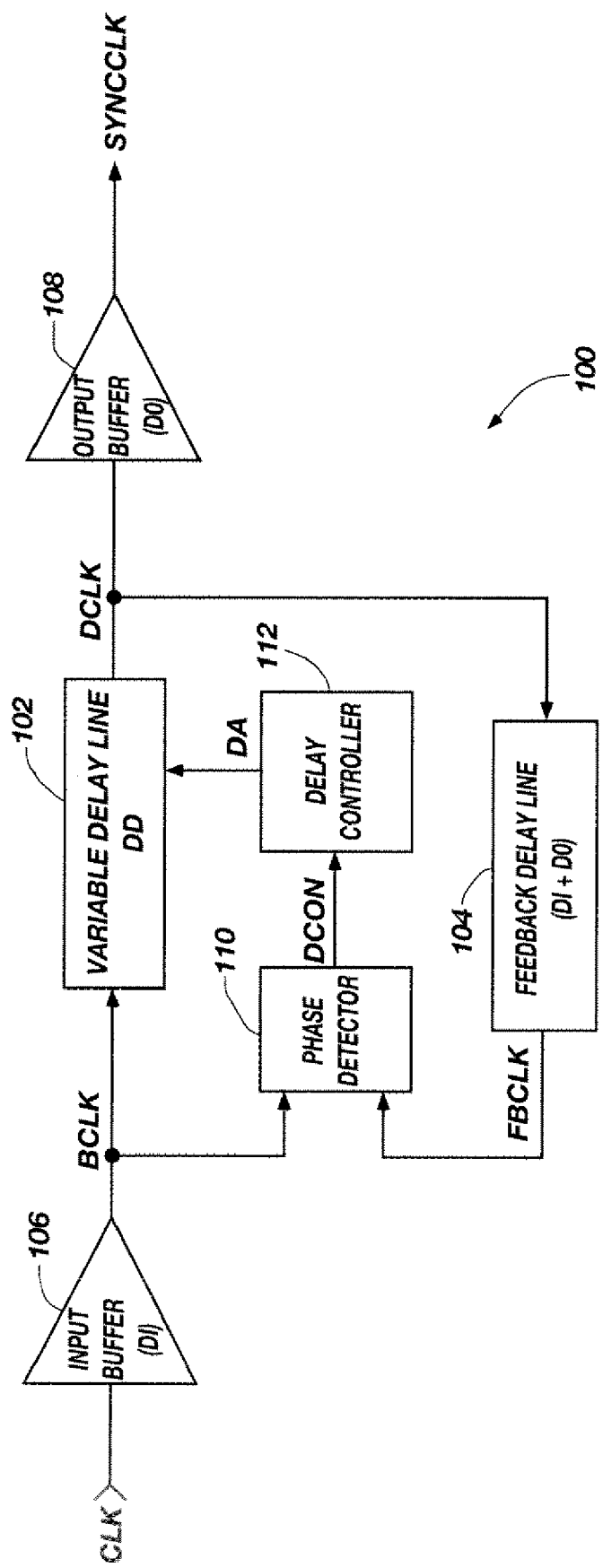
FIG. 1 is a block diagram of a conventional delay locked loop.

Feedback delay line 304 may be operably coupled between frequency divider 314 and a phase detector 310 and may be configured to receive frequency divided clock signal CLKDELD from frequency divider 314. Feedback delay line 304 may be configured to generate a feedback clock signal CLKFB in response to signal CLKDELD, wherein feedback clock signal CLKFB may have a model delay (D1+D2) relative to delayed clock signal CLKDEL. As described above in reference to FIG. 1, the D1 component of the model delay (D1+D2) corresponds to a delay introduced by input buffer 306 (or other input buffers on the semiconductor device), while the D2 component of the model delay (D1+D2) corresponds to a delay introduced by output buffer 308 (or other output buffers on the semiconductor device). Although input buffer 306 and output buffer 308 are illustrated as single components, each represents all components and the associated delay between the input and output of delay locked loop 300. Stated another way, input buffer 306 represents the delay D1 of all components between an input that receives reference clock signal CLK and the input to variable delay line 302. Moreover, output buffer 308 represents the delay D2 of all components between the output of the variable delay line 302 and an output at which synchronized clock signal CLKSYNC is generated. In addition, as a non-limiting example, some embodiments may be configured to model other input buffers and output buffers on a semiconductor device. As a non-limiting example, feedback delay line 304 may be configured to model the delay of an input buffer for a control signal (not shown) in combination with the delay of an output buffer of a data output (not shown). Still other embodiments may not use a feedback delay line 304 or the feedback delay line 304 may only model the delay of one of an input buffer or output buffer.

In addition, delay locked loop 300 may include a phase detector 310 configured to receive both buffered reference clock signal CLKBUF from input butler 306 and feedback clock signal CLKFB signal from feedback delay line 304. Furthermore, as known by one having ordinary skill in the art, phase detector 310 may be configured to generate a delay control signal DCONT having a value indicating a phase difference between signal CLKBUF and signal CLKFB. According to an embodiment of the disclosure, phase detector 310 may be configured to activate upon detection of an active edge of feedback clock signal CLKFB Stated another way, upon receipt of an active edge of feedback clock signal CLKFB, phase detector 310 may begin to measure a phase difference between signals CLKFB and CLKBUF. As such, signal CLKFB may be known as a master control clock of delay locked loop 300. According to various embodiments of the disclosure, the term "active" edge may refer to a rising edge and a falling edge of a clock signal. In other embodiments of the disclosure, an "active" edge may refer to a rising edge of a clock signal and a falling edge of a clock signal may be referred to as an "inactive" edge. Furthermore, according to one embodiment of the disclosure, phase detector 310 may be hardwired to activate upon receipt of an active edge of feedback clock signal CLKFB. In another embodiment, phase detector 310 may be configured to receive a register command used to program phase detector 310 to activate upon receipt of an active edge of feedback clock signal CLKFB.

Upon receipt of control signal DCONT, a delay controller 312 may be configured to determine a desired delay based upon control signal DCONT and, hereafter, transmit a command signal DADJ to variable delay line 302 to adjust the variable delay VD. As such, phase detector 310 and delay controller 312 may operate in combination to adjust the variable delay VD of delayed clock signal CLKDEL as a function of the detected phase difference between the CLKBUF and CLKFB signals. Furthermore, the control signal DCONT may include a value indicating a lead versus lag signal to indicate whether additional delay needs to be added to signal CLKDEL or delay needs to be removed from signal CLKDEL. In order to keep a stable feedback loop, the command signal DADJ may make relatively small adjustments to the delay on CLKDEL for any given adjustment opportunity. Also, it should be noted that variable delay VD may not require adjustment if the phase difference between signal CLKBUF and signal CLKFB is less than a specified amount.

A contemplated operation of delay locked loop 300 will now be discussed. Initially, input buffer 306 may receive reference clock signal CLK and output a buffered reference clock signal CLKBUF to variable delay line 302 and phase detector 310. Upon receipt of buffered reference clock signal CLKBUF, variable delay line 302 may adjust a loop delay by inserting or bypassing some propagation delay elements within variable delay line 302. Subsequently, variable delay line 302 may output delayed clock signal CLKDEL to output buffer 308 and frequency divider 314. Frequency divider 314 may then generate frequency divided clock signal CLKDELD having a frequency that is less than a frequency of delayed clock signal CLKDEL. For example, if frequency divider 314 is configured to generate a frequency divided clock signal CLKDELD having a frequency that is one-half of a frequency of delayed clock signal CLKDEL, frequency divider 314 may divide the frequency of delayed clock signal CLDEL by two. Thereafter, frequency divider 314 may output frequency divided cock signal CLKDELD, having a reduced frequency, to feedback delay line 304. For explanatory purposes only, and not by way of limitation, if frequency divider 314 is configured to reduce a frequency of delayed clock signal CLKDEL by one-half and delayed clock signal CLKDEL has a frequency of 1.0 GHz, frequency divided clock signal CLKDELD will have a frequency of 0.5 GHz.

Upon receipt of frequency divided clock signal CLKDELD, feedback delay line 304 may add a model delay (D1+D2) and, thereafter, output feedback clock signal CLKFB to phase detector 310. As described above, feedback clock signal CLKB may be configured as the master control and, as a result, phase detector 310 may be configured to activate upon detection of a rising edge of feedback clock signal CLKFB. Furthermore, as mentioned above and as described more fully below, according to various embodiments of the present invention, phase detector 310 may be configured to activate upon detection of a rising edge and a falling edge of feedback signal CLKFB. Subsequently, a phase difference between buffered reference clock signal CLKBUF and feedback clock signal CLKFB may be measured by phase detector 310. After determining the phase difference, phase detector 310 may output a control signal DCONT to delay controller 312. Delay controller 312 may output a command signal DADJ including an amount of delay to be introduced into or removed from variable delay line 302. Upon receipt of command signal DADJ, variable delay line 302 may adjust the variable delay VD by adding or subtracting a delay to delayed clock signal CLKDEL.

This adjustment process is repeated for each active edge of feedback clock signal CLKFB until the delay locked loop 300 has achieved lock. Of course, some embodiments may also have a lock mode using more aggressive changes to the delay amount in order to achieve lock more quickly. Then, once lock is achieved, in order to maintain a more stable clock, the delay changes may be allowed to occur less often, or in smaller increments.

Figure 4:
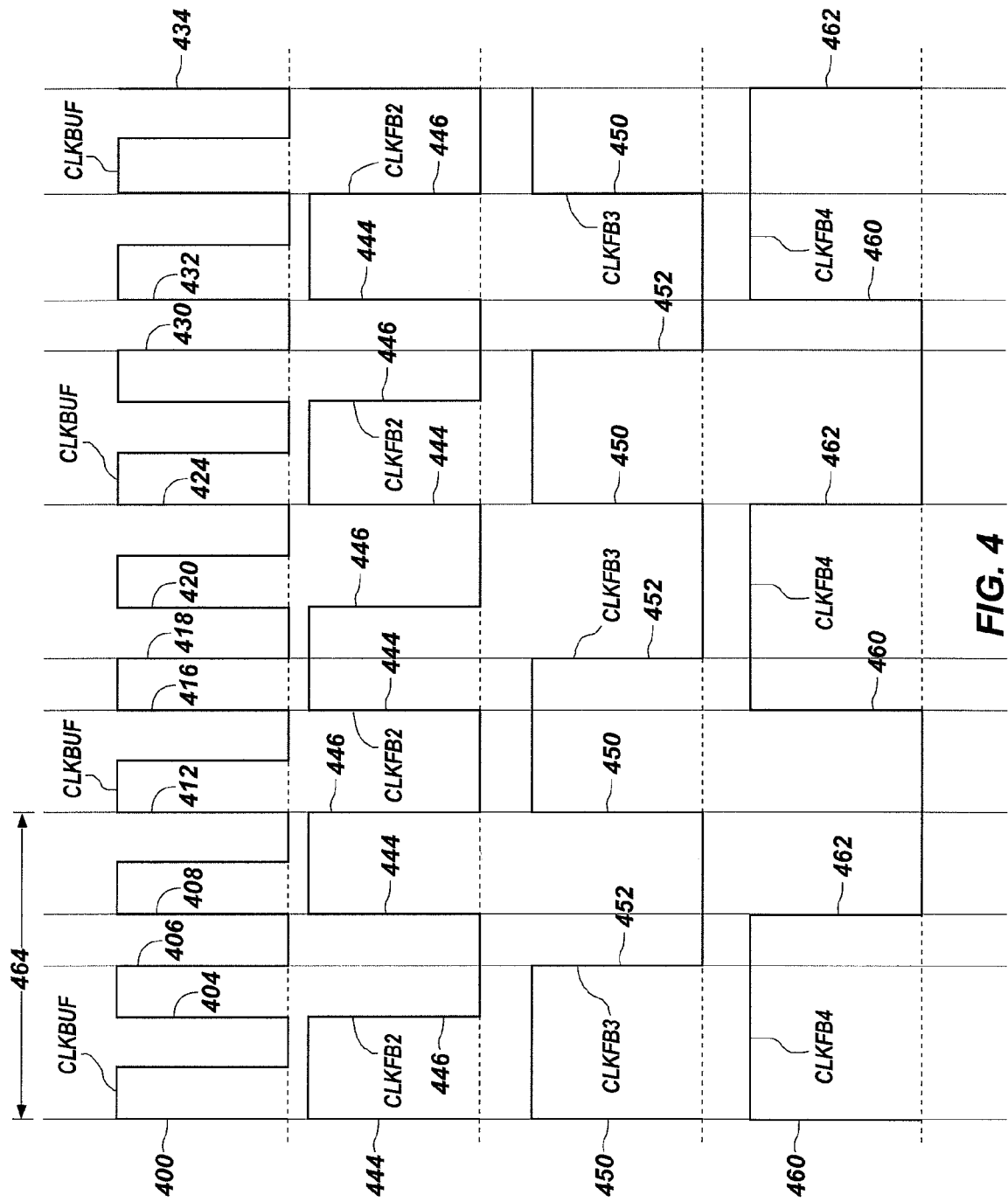
FIG. 4 illustrates a representative timing diagram of a reference clock signal and various feedback clock signals having reduced frequencies associated with a delay locked loop according to an embodiment of the disclosure.

FIG. 4 illustrates a representative timing diagram of a buffered reference clock signal CLKBUF and feedback clock signals CLKFB2, CLKFB3, and CLKFB4 having respective frequencies that are one-half, one-third, and one-fourth of the frequency of buffered reference clock signal CLKBUF. Moreover, the timing diagram illustrated in FIG. 4 represents a time period wherein reference clock signal CLK and output clock signal CLKSYNC (see FIG. 3) are synchronized. Referring to buffered reference clock signal CLKBUF and feedback clock signal CLKFB2, the rising edge 444 of feedback clock signal CLKFB2 is aligned with every odd-numbered rising edge (i.e., first rising edge 400, third rising edge 408, fifth rising edge 416, etc.) of buffered reference clock signal CLKBUF and the falling edge 446 of feedback clock signal CLKFB2 is aligned with every even-numbered rising edge (i.e., second rising edge 404, fourth rising edge 412, sixth rising edge 420, etc.) of buffered reference clock signal CLKBUF. As a result, each rising edge 444 of feedback clock signal CLKFB2 is aligned with a rising edge of buffered reference clock signal CLKBUF. Therefore, in a embodiment wherein synchronized frequency division results in a feedback clock signal CLKFB2 having a frequency that is one-half of buffered reference clock signal CLKBUF, a rising edge 444 of feedback clock signal CLKFB2 may be considered an active edge and a falling edge 446 of feedback clock signal CLKFB2 may be considered an inactive edge.

Referring to buffered reference clock signal CLKBUF and feedback clock signal CLKFB3, the rising edge 450 of feedback clock signal CLKLFB3 is aligned with every third rising edge (i.e., first rising edge 400, fourth rising edge 412, seventh rising edge 424, etc.) of buffered reference clock signal CLKBUF and the falling edge 452 of feedback clock signal CLKFB3 is aligned with every third falling edge (i.e., second falling edge 406, fifth falling edge 418, eighth falling edge 430, etc.) of buffered reference clock signal CLKBUF. As a result, each rising edge 450 of feedback clock signal CLKFB3 is aligned with a rising edge of buffered reference clock signal CLKBUF and each falling edge 452 of feedback clock signal CLKFB3 is aligned with a falling edge of buffered reference clock signal CLKBUF. Therefore, in a embodiment wherein synchronized frequency division results in a feedback clock signal CLKFB3 having a frequency that is one-third of buffered reference clock signal CLKBUF, a rising edge 450 and a falling edge 452 of feedback clock signal CLKFB2 may be considered an active edge.

Referring to buffered reference clock signal CLKLBUF and feedback clock signal CLKFB4, the rising edge 460 of feedback clock signal CLKFB4 is aligned with every other odd-numbered rising edge (e.g., starting at the first rising edge, the rising edge 460 of feedback clock signal CLKFB4 is aligned with the first rising edge 400, the fifth rising edge 416, the ninth rising edge 432, etc.) of buffered reference clock signal CLKBUF and the falling edge 462 of feedback clock signal CLKFB4 is aligned with every other odd-numbered rising edge (e.g., starting at the third rising edge of buffered reference clock signal CLKBUF, the falling edge 462 of feedback clock signal CLKFB4 is aligned with the third rising edge 408, the seventh rising edge 424, the eleventh rising edge 434, etc.) of buffered reference clock signal CLKBUF. As a result, each rising edge 460 of feedback clock signal CLKFB4 is aligned with a rising edge of buffered reference clock signal CLKBUF. Therefore, in a embodiment wherein synchronized frequency division results in a feedback clock signal CLKFB4 having a frequency that is one-fourth of buffered reference clock signal CLKBUF, a rising edge 460 of feedback clock signal CLKFB4 may be considered an active edge and a falling edge 462 of feedback clock signal CLKFB4 may be considered an inactive edge.

As a result, it will be understood by one of ordinary skill that when implementing even-numbered frequency division (e.g., division by 2, 4, 6, etc.), a rising edge of a feedback clock signal may be considered an active edge and a falling edge of the feedback clock signal may be considered an inactive edge. Furthermore, when implementing odd-numbered frequency division (e.g., division by 3, 5, 7, etc.), a rising edge and a falling edge of a feedback clock signal may each be considered an active edge. With continued reference to FIG. 4, it should be noted that each rising edge of a feedback clock signal (i.e., CLKFB2, CLKFB3, or CLKFB4) will align with a rising edge of buffered reference clock signal CLKRUF. On the other hand, a rising edge of buffered reference clock signal CLKBUF will not always align with a rising edge of a feedback clock signal and, therefore, it will be apparent to one having ordinary skill in the art that using the buffered reference clock CLKBUF as a master control clock may result in incorrect phase information.

As known in the art, a feedback loop within a delay locked loop may be configured to be disabled in order to reduce power consumption of a system. Furthermore, as known in the art, a shortcoming of disabling and enabling a feedback loop is that transient noise may be generated within the feedback loop. Therefore, a delay locked loop having a feedback loop configured to operate at a reduced frequency may be advantageous because the feedback loop may continuously be enabled while still reducing power consumption. Hence, transient noise may be reduced while reducing power consumption. Additionally, in an embodiment wherein a feedback loop having a frequency divider is disabled and subsequently enabled, the feedback loop may consume less power due to the reduced frequency and, therefore, less noise is introduced upon enabling the feedback loop.

Moreover, it may be advantageous to reduce the frequency of a feedback loop in order to reduce the average operating current of a delay locked loop. For example, if the frequency of the feedback loop path is reduced, the operating current of the feedback loop path may be reduced and, as a result, the operating current of the delay locked loop may be reduced. Furthermore, a feedback clock signal operating at lower frequencies may increase the time between a rising edge and a falling edge of the feedback clock signal. Therefore, as will be understood by one having ordinary skill in the art the feedback clock signal, having a reduced frequency, may be less susceptible to duty cycle distortion.

Similar to conventional delay locked loops having master control reference clocks, embodiments of the disclosure may be immune to control discontinuities. For example, upon turning "on" or enabling a delay locked loop 300 (see FIG. 3), phase detector 310 may be configured to wait a number of clock cycles (e.g., 3; depicted as time period 464 in FIG. 4) before measuring a phase difference between incoming signals in order for the feedback loop to flush out data remaining from a previous "on" cycle. Furthermore, since a rising edge of a reference clock signal will follow a rising edge of a feedback clock signal within one clock cycle, embodiments of the present invention may be compatible with measure initialization and two-step initialization architectures, as known by one having ordinary skill in the art.

Figure 5:
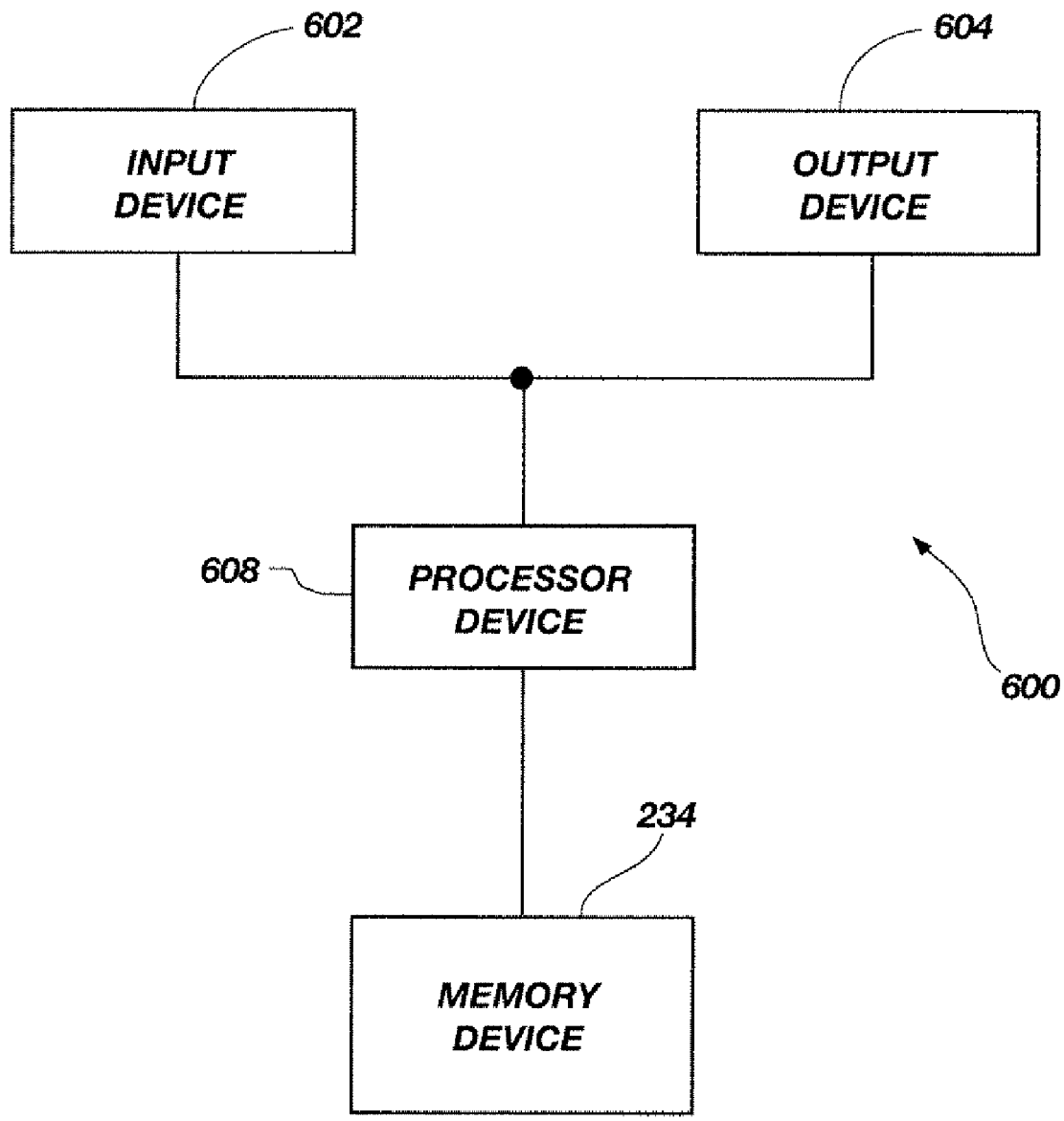
FIG. 5 is a block diagram illustrating an electronic system including a memory device with at least one delay locked loop, in accordance with an embodiment of the disclosure.

As shown in FIG. 5, an electronic system 600 includes an input device 602, an output device 604 and a memory device 234, all coupled to a processor device 608. Memory device 234 may include one or more delay locked loops 300 (see FIG. 3), according to an embodiment of the invention as described herein above. Electronic system 600 may include, by way of example only, cell phones, personal digital assistants (PDAs), computers, and other similar electronic devices.

Specific embodiments have been shown by way of non-limiting example in the drawings and have been described in detail herein; however, the various embodiments may be susceptible to various modifications and alternative forms. It should be understood that the invention is not limited to the particular forms disclosed. Rather, the invention encompasses all modifications, equivalents, and alternatives falling within the scope of the following appended claims and their legal equivalents.

What is claimed is:
1. A delay locked loop, comprising:
   a delay line configured to receive a reference signal and generate a delayed signal at a frequency and a delay amount;
   a feedback loop including a frequency divider operably coupled to the delay line and configured to receive the delayed signal and output a frequency divided signal at another frequency substantially equal to the frequency divided by an integer; and a phase detector configured to receive the reference signal and the frequency divided signal, measure a phase difference between the reference signal and the frequency divided signal, and adjust the delay amount responsive to the measured phase difference;
wherein the phase detector is configured to activate upon detection of each of a rising edge and a falling edge of the frequency divided signal if the integer is equal to an odd number and activate upon detection of the rising edge of the frequency divided signal if the integer is equal to an even number.

2. The delay locked loop of claim 1, wherein the another frequency is substantially equal to the frequency divided by one of two, four, and six.

3. The delay locked loop of claim 1, wherein the another frequency is substantially equal to the frequency divided by one of three, five, and seven.

4. The delay locked loop of claim 1, wherein the phase detector is configured to wait a number of clock cycles after enabling the feedback loop before measuring the phase difference between the reference signal and the frequency divided signal.

5. The delay locked loop of claim 1, wherein the frequency divided signal is configured as a master control clock.

6. The delay locked loop of claim 1, wherein the phase detector is configured to receive a register command used to program the phase detector to measure the phase difference between the external signal and the frequency divided signal in response to receipt of each of a rising edge and a falling edge of the frequency divided signal when the integer is equal to an odd number and in response to receipt of a rising edge of the frequency divided signal when the integer is equal to an even number.

7. The delay locked loop of claim 1, further comprising a divided internal clock driven by the frequency divided signal.

8. The delay locked loop of claim 1, wherein the frequency divider is hardwired to perform frequency division by a determined amount.

9. The delay locked loop of claim 1, wherein the frequency divider is configured to receive a register command indicating an amount of frequency division to be performed.

10. The delay locked loop of claim 1, wherein the phase detector is hardwired to measure the phase difference between the external signal and the frequency divided signal in response to receipt of each of a rising edge and a falling edge of the frequency divided signal when the integer is equal to an odd number and in response to receipt of a rising edge of the frequency divided signal when the integer is equal to an even number.

11. A method of operating a delay locked loop, comprising the acts of:
receiving a reference signal having a frequency;
generating a frequency divided signal having another frequency substantially equal to the frequency divided by an integer;
activating a phase detector upon detection of an active edge of the frequency divided signal, wherein the active edge comprises a rising edge of the frequency divided signal if the integer is equal to an even number and each of the rising edge and a falling edge of the frequency divided signal if the integer is equal to an odd number;
determining a phase difference between the reference signal and the frequency divided signal; and
adjusting a delay of the frequency divided signal responsive to the phase difference.

12. The method of claim 11, wherein generating the frequency divided signal comprises generating a frequency divided signal having another frequency that is substantially equal to one of one-half and one-fourth of the frequency.

13. The method of claim 11, wherein generating the frequency divided signal comprises generating a frequency divided signal having another frequency that is substantially equal to one-third of the frequency.

14. The method of claim 11, further comprising hardwiring the phase detector to activate upon detection of each of a rising edge and a falling edge of the frequency divided signal if the integer is equal to an odd number and activate upon detection of the rising edge of the frequency divided signal if the integer is equal to an even number.

15. The method of claim 11, further comprising programming the phase detector with a register command to activate upon detection of each of a rising edge and a falling edge of the frequency divided signal if the integer is equal to an odd number and activate upon detection of the rising edge of the frequency divided signal if the integer is equal to an even number.

16. A method of operating a delay locked loop, comprising the acts of:
inputting an external signal at a frequency;
generating a feedback signal at another frequency substantially equal to the frequency divided by an integer;
activating a phase detector with a rising edge of the feedback signal if the integer is equal to an even number and activating the phase detector with each of the rising edge and a falling edge of the feedback signal if the integer is equal to an odd number;
generating a control signal related to a phase comparison of the feedback signal and the external signal; and
adjusting a delay of the feedback signal responsive to the control signal.

17. The method of claim 16, further comprising hardwiring the phase detector to activate with each of a rising edge and a falling edge of the feedback signal if the integer is equal to an odd number and activate with the rising edge of the feedback signal if the integer is equal to an even number.

18. The method of claim 16, further comprising programming the phase detector with a register command to activate with each of a rising edge and a falling edge of the feedback signal if the integer is equal to an odd number and activate with the rising edge of the feedback signal if the integer is equal to an even number.

19. A semiconductor device, comprising:
at least one delay locked loop comprising:
a forward path adapted to receive an external signal and generate a delayed signal at a frequency;
a feedback loop operably coupled to the forward path and adapted to receive the delayed signal and generate a frequency divided signal having another frequency substantially equal to the frequency divided by an integer; and
a phase detector adapted to receive the external signal and the frequency divided signal and generate a control signal related to a phase comparison of the reference signal and the frequency divided signal;
wherein the phase detector is configured to activate upon detection of each of a rising edge and a falling edge of the frequency divided signal when the integer is equal to an odd number and activate upon detection of a rising edge of the frequency divided signal when the integer is equal to an even number.

20. The semiconductor device of claim 19, wherein the feedback loop comprises a frequency divider adapted to generate the frequency divided signal.

21. The semiconductor device of claim 19, wherein phase detector is configured to be programmed with a register command to activate upon detection of each of a rising edge and a falling edge of the frequency divided signal when the integer is equal to an odd number and activate upon detection of a rising edge of the frequency divided signal when the integer is equal to an even number.

22. The semiconductor device of claim 19, wherein phase detector is hardwired to activate upon detection of each of a rising edge and a falling edge of the frequency divided signal when the integer is equal to an odd number and activate upon detection of a rising edge of the frequency divided signal when the integer is equal to an even number.

23. An electronic system, comprising:
  at least one processor; at least one memory device; and
  at least one delay lock loop operably associated with the at least one memory device and comprising:
    a delay line operably coupled between an input and an output and adapted to receive an external signal and generate a delayed signal in response to receipt of the external signal;
    a frequency divider operably coupled to the delay line and configured to generate a frequency divided signal in response to receipt of the delayed signal, wherein a frequency of the frequency divided signal is substantially equal to the frequency divided by an integer; and
    a phase detector operably coupled to the input and the frequency divider and configured to measure a phase difference between the external signal and the frequency divided signal in response to receipt of each of a rising edge and a falling edge of the frequency divided signal when the integer is equal to an odd number and in response to receipt of the rising edge of the frequency divided signal when the integer is equal to an even number.

24. The electronic system of claim 23, wherein the delay locked loop is positioned within the at least one memory device.

25. The electronic system of claim 23, wherein the delay locked loop is positioned within a memory controller operably coupled to the at least one memory device.

* * * * *